(12) United States Patent
Nakamura et al.

(10) Patent No.: US 10,735,016 B2
(45) Date of Patent: Aug. 4, 2020

(54) D/A CONVERSION CIRCUIT, QUANTIZATION CIRCUIT, AND A/D CONVERSION CIRCUIT

(71) Applicant: DENSO CORPORATION, Kariya, Aichi-pref. (JP)

(72) Inventors: Kunihiko Nakamura, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/555,042

(22) Filed: Aug. 29, 2019

(65) Prior Publication Data

US 2020/0112318 A1    Apr. 9, 2020

(30) Foreign Application Priority Data

Oct. 4, 2018 (JP) .................................. 2018-189231
Nov. 20, 2018 (JP) .................................. 2018-217265

(51) Int. Cl.
| | |
|---|---|
| H03M 1/36 | (2006.01) |
| H03M 3/00 | (2006.01) |
| H03M 1/66 | (2006.01) |
| H03M 1/46 | (2006.01) |

(52) U.S. Cl.
CPC ........... H03M 1/361 (2013.01); H03M 1/466 (2013.01); H03M 1/66 (2013.01); H03M 3/30 (2013.01)

(58) Field of Classification Search
CPC ......... H03M 1/361; H03M 1/466; H03M 1/66
USPC .......................................... 341/143–155, 200
See application file for complete search history.

(56) References Cited

U.S. PATENT DOCUMENTS

| | | | |
|---|---|---|---|
| 4,616,212 A * | 10/1986 | Law ..................... | H03M 1/804 341/145 |
| 6,081,218 A | 6/2000 | Ju et al. | |
| 7,102,558 B2 | 9/2006 | Deval | |
| 7,388,533 B2 | 6/2008 | Kim et al. | |
| 8,970,416 B2 | 3/2015 | Quiquempoix | |
| 9,281,837 B2 * | 3/2016 | Nezuka ................ | H03M 3/368 |
| 2007/0052566 A1 * | 3/2007 | Sutardja ............... | H03M 1/682 341/144 |
| 2008/0316074 A1 * | 12/2008 | Chida .................. | H03M 1/0818 341/143 |
| 2012/0306671 A1 * | 12/2012 | Kapusta ............... | H03M 1/1057 341/110 |
| 2016/0043733 A1 * | 2/2016 | Nezuka ................ | H03M 3/464 341/143 |

(Continued)

*Primary Examiner* — Lam T Mai
(74) *Attorney, Agent, or Firm* — Posz Law Group, PLC

(57) ABSTRACT

A D/A conversion circuit includes: an output terminal connected to an operational amplifier connected to a quantization circuit; a DAC capacitor; a selection switch switching among reference, first and second voltages to apply to the DAC capacitor as an analog potential; a ground switch connecting the DAC capacitor to a ground; and an output switch connecting the DAC capacitor to the output terminal. In a first period, the selection switch selects one of the reference, first and second voltages according to a quantization result value from the quantization circuit, and connects the one to the DAC capacitor, and the ground switch turns on to charge the DAC capacitor. In a second period, the selection switch selects another one of the first and second voltages, and connects the another one to the DAC capacitor, and the output switch turns on to output the analog potential to the output terminal.

11 Claims, 12 Drawing Sheets

(56) References Cited

U.S. PATENT DOCUMENTS

2019/0363731 A1* 11/2019 Nezuka ................ H03M 3/464

* cited by examiner

FIG. 2

| PHASE | THRESHOLD VOLTAGE TO BE USED |
|---|---|
| 1ST TIME $\begin{pmatrix} 1-1 \\ 1-2 \end{pmatrix}$ | Vth2+<br>Vth1+<br>Vth0<br>Vth1−<br>Vth2− |
| 2ND TIME $\begin{pmatrix} 2-1 \\ 2-2 \end{pmatrix}$ | Vth1+<br>Vth0<br>Vth1− |

FIG. 3

| SW | CONNECTION | SAMPLE | HOLD |
|---|---|---|---|
| Ss1 | Vin | ON | OFF |
| Ss2 | AGND | ON | OFF |
| Ss3 | amp | OFF | ON |
| Ss4 | AGND | OFF | ON |

FIG. 4

| SW | CONNECTION | Qout 2 (L→H) | Qout 1 (0→H) | Qout −1 (0→L) | Qout −2 (H→L) |
|---|---|---|---|---|---|
| Sdt | Vrefp (H) | OFF→ON | OFF→ON | OFF | ON→OFF |
| Sdm | Vcm (0) | OFF | ON→OFF | ON→OFF | OFF |
| Sdb | Vrefm (L) | ON→OFF | OFF | OFF→ON | OFF→ON |
| Sd2 | AGND | ON→OFF | ON→OFF | ON→OFF | ON→OFF |
| Sd3 | amp | OFF→ON | OFF→ON | OFF→ON | OFF→ON |

| | 1ST QUANTIZATION | 2ND QUANTIZATION |
|---|---|---|

| Qout1/Qout2 | DAC | |
|---|---|---|
| | SAMPLE | HOLD |
| 2 | L | H |
| 1 | O | H |
| −1 | O | L |
| −2 | H | L |

1ST QUANTIZATION

| SYMBOL | CONDITION | Qout1 |
|---|---|---|
| 1a | V1 ≥ Vth2+ | 2 |
| 1b | Vth2+ > V1 ≥ Vth1+ | 1 |
| 1c | Vth1+ > V1 ≥ Vth0 | −1 |
| 1d | Vth0 > V1 ≥ Vth1− | 1 |
| 1e | Vth1− > V1 ≥ Vth2− | −1 |
| 1f | Vth2− > V1 | −2 |

FIG. 9

2ND QUANTIZATION

| SYMBOL | CONDITION | Qout2 |
|---|---|---|
| 2a | $V2 \geq Vth1+$ | 2 |
| 2b | $Vth1+ > V2 \geq Vth0$ | 1 |
| 2c | $Vth0 > V2 \geq Vth1-$ | −1 |
| 2d | $Vth1- > V2$ | −2 |

FIG. 10

| CONDITION | Qout1 | Qout2 | Qout1+Qout2 |
|---|---|---|---|
| $V1 \geq Vth2+$ | 2 | 2 | 4 |
| $Vth2+ > V1 \geq Vth1++VR$ | 1 → 2 | 2 | 3 |
| $Vth1++VR > V1 \geq Vth1+$ | 1 → 1 | 1 | 2 |
| $Vth1+ > V1 \geq Vth1+-VR$ | −1 → 2 | 2 | 1 |
| $Vth1+-VR > V1 \geq Vth0$ | −1 → 1 | 1 | 0 |
| $Vth0 > V1 \geq Vth1-+VR$ | 1 → −1 | −1 | 0 |
| $Vth1-+VR > V1 \geq Vth1-$ | 1 → −2 | −2 | −1 |
| $Vth1- > V1 \geq Vth1--VR$ | −1 → −1 | −1 | −2 |
| $Vth1--VR > V1 \geq Vth2-$ | −1 → −2 | −2 | −3 |
| $Vth2- > V1$ | −2 | −2 | −4 |

* HERE VR = Cd/Cf × Vref

FIG. 11

| CONDITION | Qout 1 | Qout 2 | Qout1 +Qout2 |
|---|---|---|---|
| V1 $\geq$ 7/16Vref | 2 | 2 | 4 |
| 7/16Vref > V1 $\geq$ 5/16Vref | 1 | 2 | 3 |
| 5/16Vref > V1 $\geq$ 3/16Vref | 1 | 1 | 2 |
| 3/16Vref > V1 $\geq$ 1/16Vref | −1 | 2 | 1 |
| 1/16Vref > V1 $\geq$ 0 | −1 | 1 | 0 |
| 0 > V1 $\geq$ −1/16Vref | 1 | −1 | 0 |
| −1/16Vref > V1 $\geq$ −3/16Vref | 1 | −2 | −1 |
| −3/16Vref > V1 $\geq$ −5/16Vref | −1 | −1 | −2 |
| −5/16Vref > V1 $\geq$ −7/16Vref | −1 | −2 | −3 |
| −7/16Vref > V1 | −2 | −2 | −4 |

Vth2+ = 7/16Vref(V)
Vth1+ = 3/16Vref(V)
Vth0 = 0 (V)
Vth1- = −3/16Vref(V)
Vth2- = −7/16Vref(V)
VR = 2/16Vref(V)
* HERE Cd/Cf=1/8

FIG. 14

| CONDITION | | | Qout 1 | Qout 2 | Qout1 +Qout2 |
|---|---|---|---|---|---|
| | V1 | ≥ Vth1++2VR | 2 → | 2 | 4 |
| Vth1++2VR > | V1 | ≥ Vth2+ | 2 → | 1 | 3 |
| Vth2+ > | V1 | ≥ Vth1+ | 1 | 1 | 2 |
| Vth1+ > | V1 | ≥ Vth1+ −VR | −1 → | 2 | 1 |
| Vth1+ −VR > | V1 | ≥ Vth0 | −1 → | 1 | 0 |
| Vth0 > | V1 | ≥ Vth1- +VR | 1 → | −1 | 0 |
| Vth1- +VR > | V1 | ≥ Vth1- | 1 → | −2 | −1 |
| Vth1- > | V1 | ≥ Vth2- | −1 | −1 | −2 |
| Vth2- > | V1 | ≥ Vth1- −2VR | −2 → | −1 | −3 |
| Vth1- −2VR > | V1 | | −2 → | −2 | −4 |

\* HERE VR = Cd/Cf X Vref

FIG. 15

| CONDITION | Qout 1 | Qout 2 | Qout1 +Qout2 |
|---|---|---|---|
| $V1 \geq 7/16Vref$ | 2 | 2 | 4 |
| $7/16Vref > V1 \geq 5/16Vref$ | 2 | 1 | 3 |
| $5/16Vref > V1 \geq 3/16Vref$ | 1 | 1 | 2 |
| $3/16Vref > V1 \geq 1/16Vref$ | −1 | 2 | 1 |
| $1/16Vref > V1 \geq 0$ | −1 | 1 | 0 |
| $0 > V1 \geq -1/16Vref$ | 1 | −1 | 0 |
| $-1/16Vref > V1 \geq -3/16Vref$ | 1 | −2 | −1 |
| $-3/16Vref > V1 \geq -5/16Vref$ | −1 | −1 | −2 |
| $-5/16Vref > V1 \geq -7/16Vref$ | −2 | −1 | −3 |
| $-7/16Vref > V1$ | −2 | −2 | −4 |

$Vth2+ = 5/16Vref(V)$
$Vth1+ = 3/16Vref(V)$
$Vth0 = 0 (V)$
$Vth1- = -3/16Vref(V)$
$Vth2- = -5/16Vref(V)$
$VR = 2/16Vref(V)$

* HERE Cd/Cf=1/8

FIG. 18

| CONDITION | | | Qout 1 | Qout 2 | Qout1 +Qout2 |
|---|---|---|---|---|---|
| | $V1$ | $\geq Vth1+ +2VR$ | 2 | 2 | 4 |
| $Vth1+ +2VR >$ | $V1$ | $\geq Vth2+$ | 2 | 1 | 3 |
| $Vth2+ >$ | $V1$ | $\geq Vth1+ +VR$ | 1 | 2 | 3 |
| $Vth1+ +VR >$ | $V1$ | $\geq Vth1+$ | 1 | 1 | 2 |
| $Vth1+ >$ | $V1$ | $\geq Vth1+ -VR$ | −1 | 2 | 1 |
| $Vth1+ -VR >$ | $V1$ | $\geq Vth0$ | −1 | 1 | 0 |
| $Vth0 >$ | $V1$ | $\geq Vth1- +VR$ | 1 | −1 | 0 |
| $Vth1- +VR >$ | $V1$ | $\geq Vth1-$ | 1 | −2 | −1 |
| $Vth1- >$ | $V1$ | $\geq Vth1- -VR$ | −1 | −1 | −2 |
| $Vth1- -VR >$ | $V1$ | $\geq Vth2-$ | −1 | −2 | −3 |
| $Vth2- >$ | $V1$ | $\geq Vth1- -2VR$ | −2 | −1 | −3 |
| $Vth1- -2VR >$ | $V1$ | | −2 | −2 | −4 |

\* HERE $VR = Cd/Cf \times Vref$

FIG. 19

| CONDITION | | | Qout 1 | Qout 2 | Qout1 +Qout2 |
|---|---|---|---|---|---|
| | V1 ≥ | 7/16Vref | 2 | 2 | 4 |
| 7/16Vref > | V1 ≥ | 6/16Vref | 2 | 1 | 3 |
| 6/16Vref > | V1 ≥ | 5/16Vref | 1 | 2 | 3 |
| 5/16Vref > | V1 ≥ | 3/16Vref | 1 | 1 | 2 |
| 3/16Vref > | V1 ≥ | 1/16Vref | −1 | 2 | 1 |
| 1/16Vref > | V1 ≥ | 0 | −1 | 1 | 0 |
| 0 > | V1 ≥ | −1/16Vref | 1 | −1 | 0 |
| −1/16Vref > | V1 ≥ | −3/16Vref | 1 | −2 | −1 |
| −3/16Vref > | V1 ≥ | −5/16Vref | −1 | −1 | −2 |
| −5/16Vref > | V1 ≥ | −6/16Vrefr | −1 | −2 | −3 |
| −6/16Vref > | V1 ≥ | −7/16Vref | −2 | −1 | −3 |
| −7/16Vref > | V1 | | −2 | −2 | −4 |

Vth2+ = 6/16Vref(V)
Vth1+ = 3/16Vref(V)
Vth0 = 0 (V)
Vth1- = −3/16Vref(V)
Vth2- = −6/16Vref(V)
VR = 2/16Vref(V)

* HERE Cd/Cf=1/8

D/A CONVERSION CIRCUIT, QUANTIZATION CIRCUIT, AND A/D CONVERSION CIRCUIT

CROSS REFERENCE TO RELATED APPLICATIONS

The present application claims the benefit of priority from Japanese Patent Applications No. 2018-189231 filed on Oct. 4, 2018 and No. 2018-217265 filed on Nov. 20, 2018. The entire disclosure of the above application is incorporated herein by reference.

TECHNICAL FIELD

The present disclosure relates to a D/A conversion circuit, a quantization circuit, and an A/D conversion circuit having a configuration using those circuits.

BACKGROUND

Among D/A conversion circuits, there are some of the D/A conversion circuits used in a $\Delta\Sigma$ (delta sigma) modulation type A/D conversion circuit having an outputtable level set to five levels. In this example, three levels (Vrefp, Vcm, Vrefm) of high, medium, and low are generally set as reference potentials at analog level voltages.

SUMMARY

According to an example embodiment, a D/A conversion circuit includes: an output terminal connected to an operational amplifier connected to a quantization circuit; a DAC capacitor; a selection switch switching among reference, first and second voltages to apply to the DAC capacitor as an analog potential; a ground switch connecting the DAC capacitor to a ground; and an output switch connecting the DAC capacitor to the output terminal. In a first period, the selection switch selects one of the reference, first and second voltages according to a quantization result value from the quantization circuit, and connects the one to the DAC capacitor, and the ground switch turns on to charge the DAC capacitor. In a second period, the selection switch selects another one of the first and second voltages, and connects the another one to the DAC capacitor, and the output switch turns on to output the analog potential to the output terminal.

BRIEF DESCRIPTION OF THE DRAWINGS

The above and other objects, features and advantages of the present disclosure will become more apparent from the following detailed description made with reference to the accompanying drawings. In the drawings:

FIG. 2 is a diagram showing a relationship between a phase and a threshold in A/D conversion;

FIG. 3 is a diagram showing an operation relationship between a sampling period and a holding period of a switch of an input circuit;

FIG. 4 is a diagram showing an operation relationship of a switch of a D/A conversion circuit between a sampling period and a holding period corresponding to a value of Qout;

FIG. 9 is a diagram showing a condition of the second quantization by a threshold voltage;

FIG. 10 is a diagram showing a combination of the conditions of the first quantization and the second quantization by a threshold voltage;

FIG. 11 is a diagram showing a combination of the conditions of the first quantization and the second quantization by a reference voltage;

FIG. 14 is a diagram showing a combination of the conditions of the first quantization and the second quantization by a threshold voltage;

FIG. 15 is a diagram showing a combination of the conditions of the first quantization and the second quantization by a reference voltage;

FIG. 18 is a diagram showing a combination of the conditions of the first quantization and the second quantization by a threshold voltage; and FIG. 19 is a diagram showing a combination of the conditions of the first quantization and the second quantization by a reference voltage.

DETAILED DESCRIPTION

Figure 1:
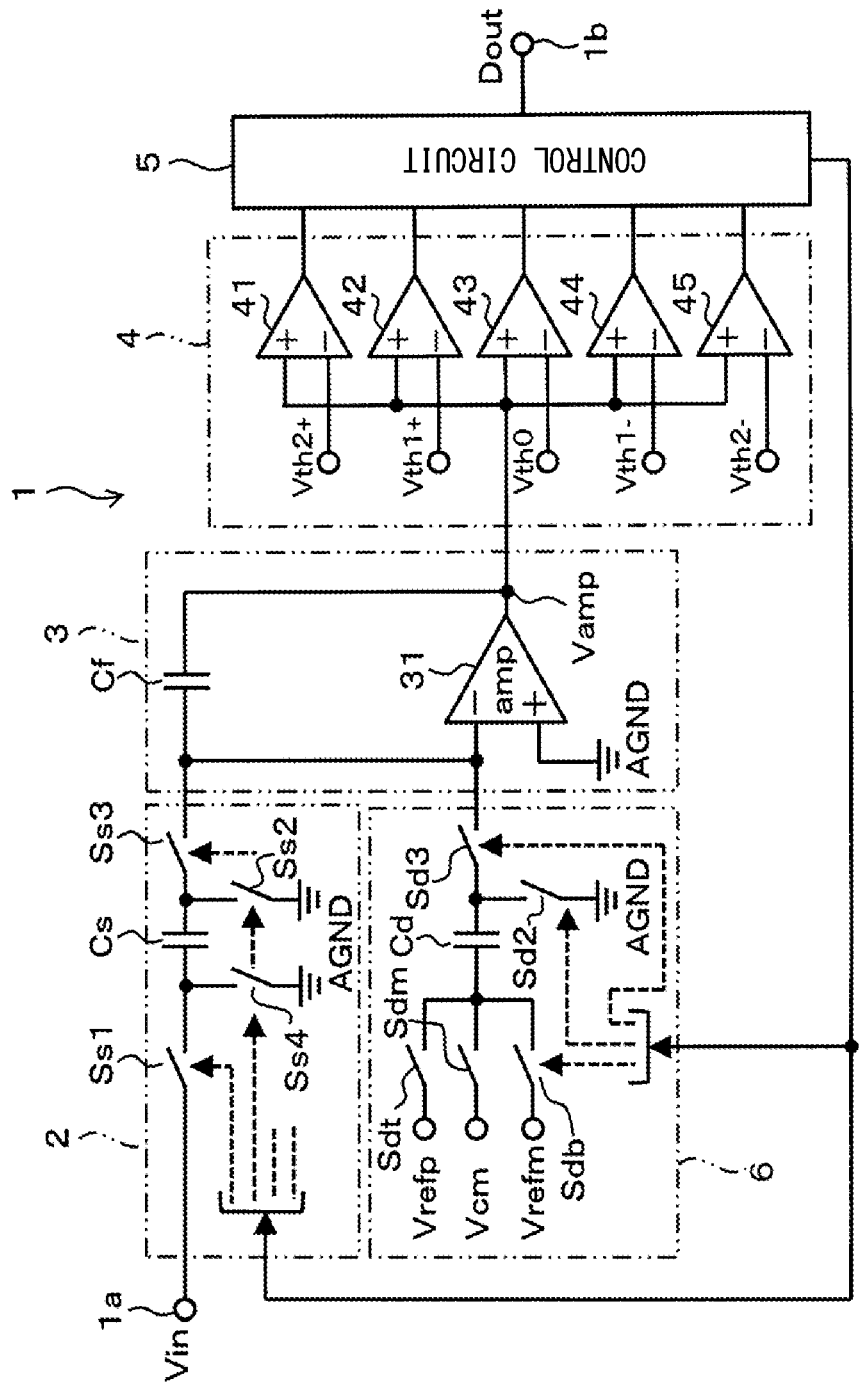
FIG. 1 is an electric configuration diagram showing a first embodiment.

Usually, Vcm among the three reference potentials is set to the same potential as the reference potential of the operational amplifier (analog ground: AGND), and Vrefp and Vrefn are set to satisfy Vrefp+Vrefm=Vcm/2. In other words, when Vcm=0 V, Vrefm=−Vrefp is satisfied.

When an analog signal corresponding to "0" is output among the five output levels that can be output corresponding to the input five digital signals (−2, −1, 0, 1, 2), Vcm corresponding to an analog ground potential is selected and output to the DAC capacitor in each of a sampling period and a holding period.

In that case, since a non-inverting input terminal of an operational amplifier connected to the D/A conversion circuit is set to a ground potential and the non-inverting input terminal and an inverting input terminal are virtually grounded, one end of the DAC capacitor connected to the inverting input terminal becomes the ground potential. As described above, since Vcm=AGND (analog ground) is met, when Vcm is selected as the reference potential of the D/A conversion circuit, a potential difference should ideally not occur between both ends of the DAC capacitor.

In general, a capacitive element has an electric characteristic in which a capacitance value changes in accordance with the potential difference applied to the both ends. For that reason, when the potential of the inverting input terminal is different from that of the AGND due to the offset of the amplifier connected to an output portion of the DAC capacitor, electric charges corresponding to a capacitance value depending on the offset and the potential difference between both ends of the capacitive element are accumulated in the DAC capacitor. In the holding period, since the potential difference between the both ends of the DAC capacitor greatly differs depending on the reference voltage, the value of the DAC capacitance also fluctuates depending on the selected reference voltage.

As a result, since the amount of electric charges subtracted by the D/A conversion circuit also fluctuates, when the DAC that selects one reference voltage from the multiple different reference voltages in the holding period is used in the A/D conversion circuit, linearity may be lowered as the characteristics of the A/D conversion due to the voltage characteristics of the capacitance value of the DAC capacitor and the offset of the operational amplifier.

A D/A conversion circuit is provided such that the circuit reduces an adverse effect of electric characteristics of a capacitor provided inside, and is high in speed and high in accuracy. A quantization circuit and an A/D conversion circuit corresponding to the D/A conversion circuit are also provided.

According to an example embodiment, a D/A conversion circuit having an output terminal connected to an input terminal of an operational amplifier that is connected to a quantization circuit, the D/A conversion circuit includes: a DAC capacitor; a selection switch that selectively switches among a reference potential, a first voltage higher than the reference potential, and a second voltage lower than the reference potential to apply an input side of the DAC capacitor as an analog potential; a ground switch that connects an output side of the DAC capacitor to an analog ground potential; and an output switch that connects the output side of the DAC capacitor to the output terminal. In a first period, the selection switch selects one of the reference potential, the first voltage and the second voltage according to one of four levels output from the quantization circuit as a quantization result value, and connects the one of the reference potential, the first voltage and the second voltage to the input side of the DAC capacitor, and the ground switch turns on to charge the DAC capacitor. In a second period subsequent to the first period, the selection switch selects one of the first voltage and the second voltage, and connects the one of the first voltage and the second voltage to the input side of the DAC capacitor, and the output switch turns on to output the analog potential having one of four levels to the output terminal from the DAC capacitor.

In the configuration described above, the D/A conversion circuit selectively connects the selection switch to any potential to charge the DAC capacitor according to the input 4-level input digital signal in the first period, and selectively connects the selection switch to any one of Vrefp and Vrefm and outputs the potential of the DAC capacitor to the output terminal in a subsequent second period. As a result, even when Vcm is selected in the first period, since the condition for selecting Vcm is not used in the second period, an influence of the voltage characteristic of the capacitance value of the DAC capacitor and the offset of the operational amplifier at the time of transfer of the electric charges from the DAC capacitor can be reduced, and the analog potential can be output with high accuracy as the output.

The present inventors have considered the following points in order to obtain the configuration and operation described above.

In other words, since a high-precision A/D conversion circuit generally uses a differential circuit configuration, even if the voltage characteristic exists in the DAC capacitor, a sum of the DAC capacities on both sides of the differential becomes equal because the other side of the differential becomes Vrefm (Vrefp) when Vrefp (Vrefm) is selected to one side of the differential.

However, when Vcm is selected, although the potentials at both ends of the DAC capacitance are affected by the offsets, the potentials are substantially the same, and therefore the capacitance value of the DAC capacitor differs by the voltage characteristics as compared with the case where Vrefp or Vrefn is selected as the reference voltage. As a result, particularly in the differential configuration, when the reference voltages Vrefp and Vrefm are selected and when the reference voltage Vcm is selected in the second period, the amount of electric charges subtracted by the DAC capacitor varies due to the offset of the amplifier. In other words, the linearity of the A/D conversion is lowered.

In that instance, the Vrefp and Vrefm are supplied from an external power source, or an IC has a dedicated external terminal in many cases, and the impedances between the input side of the DAC capacitor and Vrefp as well as Vrefm are low impedances in many cases. On the other hand, since Vcm is often generated at the amplifier inside the IC, the impedance between the input side of the DAC capacitor and Vcm tends to be higher than the impedance between Vrefp and Vrefm.

When Vcm is selected as the reference voltage, the switch for selecting Vcm is often at a potential intermediate between the power supply for driving the switch and the ground (a potential different from the analog ground and a negative potential if the analog ground is set to 0 V) and, in such a case, the on-resistance of the switch tends to be high. As a result, in the case where Vcm is selected in the second period, the performance of the amplifier for generating Vcm and the on-resistance of the switch for selecting Vcm are all affected, so that there arises a difficulty that the operation speed is lowered.

Therefore, since the above-mentioned difficulty can be avoided, a high-speed and high-precision D/A conversion can be performed while avoiding a technical difficulty depending on the voltage characteristic of the output capacitor.

First Embodiment

Hereinafter, a first embodiment in which a D/A conversion circuit is used in a ΔΣ modulation type A/D conversion circuit will be described with reference to FIGS. 1 to 11.

In FIG. 1, a ΔΣ modulation-type A/D conversion circuit (hereinafter, simply referred to as an A/D conversion circuit) 1 includes an input terminal 1*a* of an analog input Vin and an output terminal 1*b* of a digital output Dout. The A/D conversion circuit 1 includes an input circuit 2, an integrator circuit 3, a quantization circuit 4, a control circuit 5, and a D/A conversion circuit 6.

The input circuit 2 includes a sampling capacitor Cs and four switches Ss1 to Ss4. The input terminal 1*a* is connected to the integrator circuit 3 through a switch Ss1, a capacitor Cs, and a switch Ss3 in series. Input and output sides of the capacitor Cs are connected to an analog ground AGND (hereinafter simply referred to as AGND) through the switches Ss4 and Ss2, respectively. The on/off operation of the four switches Ss1 to Ss4 is controlled by the control circuit 5. In this example, the AGND can be arbitrarily set, and is not necessarily limited to 0 V as described in the present embodiment.

The switch Ss1 and the switch Ss2 are turned on and the switch Ss3 and the switch Ss4 are turned off, as a result of which one end of the sampling capacitor Cs on the integrator circuit 3 side is electrically disconnected from the integration circuit 3 and connected to the AGND. As a result, electric charges corresponding to the analog input Vin are accumulated in the sampling capacitor Cs. The switches Ss1 and Ss2 are turned off, and the switches Ss3 and Ss4 are turned on, as a result of which the electric charges accumulated in the sampling capacitor Cs are transferred to a feedback capacitor Cf of the integrator circuit 3.

The integrator circuit 3 includes an amplifier 31 and the feedback capacitor Cf. An inverting input terminal of the amplifier 31 is connected to the switch Ss3 of the input circuit 2 and is connected to the output terminal through the capacitor Cf. A non-inverting input terminal of the amplifier 31 is connected to an analog ground. The AGND is a reference potential of the amplifier 31, and in turn, is a reference potential of the entire A/D conversion circuit 1.

The quantization circuit 4 includes five comparators 41 to 45. Threshold voltages Vth2+, Vth1+, Vth0, and Vth1− and Vth2− are applied to inverting input terminals of the five comparators 41 to 45, respectively. The non-inverting input terminals of the five comparators 41 to 45 are commonly connected to an output terminal of the amplifier 31.

The comparators 41 to 45 compare the output voltage Vamp of the amplifier with the respective threshold voltages Vth2+, Vth1+, Vth0, and Vth1− and Vth2−, and output the result as a quantization result Qout to the control circuits 5 described later. In the present embodiment, the quantization result Qout of four levels "2", "1", "−1", and "−2" is output.

The control circuit 5 outputs a control signal corresponding to the quantization result Qout to a D/A conversion circuit 6 to be described later, and outputs a result obtained by performing signal processing such as integration or filtering on the quantization result Qout as an A/D conversion result Dout to the output terminal 1b.

The five threshold voltages Vth2+, Vth1+, Vth0, and Vth1− and Vth2− described above are generated by a threshold generation circuit (not shown). In that instance, Vth0 is a reference threshold and is set to an AGND level, and Vth1+ is a positive first threshold and is set to a potential higher than Vth0 by a first voltage. Vth2+ is a positive second threshold, and is set to a potential higher than Vth1+ and higher than Vth0 by a second voltage. Further, Vth1− is a negative first threshold, and is set to a potential lower than Vth0 by the first voltage. Vth2− is a negative second threshold, and is set to a potential lower than Vth1− and lower than Vth0 by a second voltage.

When the AGND level is 0V, Vth1+ and Vth1− are set to the positive and negative levels in which the absolute value Vth1 of the first voltage is the same, and the Vth2+ and the Vth2− are set to the positive and negative levels in which the absolute value Vth2 of the second voltage is larger than Vth1. As will be described later, Vth1 and Vth2 are set at levels related to the reference voltage Vref.

The D/A conversion circuit 6 includes a DAC capacitor Cd and five switches Sdt, Sdm, Sdb, Sd2, and Sd3. In the D/A conversion circuit 6, three analog potentials, that is, Vrefp, Vrefm, and Vcm, are set as reference potentials. For example, Vcm as the reference potential is set to AGND, Vrefp is set to a potential higher than AGND, and Vrefm is set to a potential lower than AGND.

When the AGND is 0V, the absolute values of Vrefp and Vrefm are the same and the signs are opposite to each other, and are set so as to satisfy Vrefp=−Vrefm. The switches Sdt, Sdm, and Sdb function as selection switches, and connect Vrefp, Vcm, and Vrefm to the inputs of the DAC capacitor Cd. In other words, the potential on the input side of the DAC capacitor Cd is equal to any one of Vrefp, Vrefm, and Vcm which is exclusively selected by the switches Sdt, Sdm, and Sdb.

The output side of the DAC capacitor Cd is connected to the AGND through the switch Sd2, and the output side of the DAC capacitor Cd is connected to an intermediate point between the inverting input terminal of the amplifier 31 and the feedback capacitor Cf through the switch Sd3. The on/off operation of the five switches Sdt, Sdm, Sdb, Sd2, and Sd3 is controlled by the control circuit 5.

In that case, the control circuit 5 performs the sample operation and the hold operation on the basis of the signal supplied from the quantization circuit 4. In the sample operation, the control circuit 5 stores a predetermined electric charge by turning on the switch Sd2 while turning off the switch Sd3 and turning on any one of the selection switches Sdt, Sdm, and Sdb. In the holding operation, the control circuit 5 turns on the switch Sd3 while turning off the switch Sd2, and turns on any one of the selection switch Sdt and the selection switch Sdb.

As a result, the electric charge accumulated in the DAC capacitor Cd during a sample operation period and the electric charge corresponding to the potential on the input side of the DAC capacitor Cd determined by turning on any one of the switches Sdt and Sdb are transferred to the feedback capacitor Cf. In other words, the D/A conversion circuit 6 performs subtraction according to the quantization result Qout.

FIG. 2 shows a relationship between phases and the threshold voltages in the A/D conversion processing of the analog potential Vin by the A/D conversion circuit 1. The phases indicate a first quantization and a second quantization, and the threshold voltages used in the sample operation and the hold operation in each phase are indicated. In this example, in the first quantization, the quantization circuit 4 use all of the five threshold voltages Vth2+, Vth1+, Vth0, and Vth1−, and Vth2−. In the second quantization, the three threshold voltages Vth1+, Vth0, and Vth1− are used in the quantization circuit 4.

In the above configuration, in the present embodiment, for example, the sample capacitor Cs and the feedback capacitor Cf are set to the same capacitance value, and the DAC capacitor Cd is set to a capacitance value of ⅛ of the feedback capacitance Cf.

$$Cs=Cf$$

$$Cd=Cf/8$$

Further, the five threshold voltages Vth2+, Vth1+, Vth0, and Vth1− and Vth2− described above as the threshold voltages are set to voltages generated by dividing the reference voltage Vref as follows.

$$Vth2+=7/16 \times Vref(V)$$

$$Vth1+=3/16 \times Vref(V)$$

$$Vth0=0(V)$$

$$Vth1-=-3/16 \times Vref(V)$$

$$Vth2-=-7/16 \times Vref(V)$$

Next, the operation of the above configuration will be described with reference to FIGS. 3 to 10. First, the basic operation of each switch in the input circuit 2 and the D/A conversion circuit 6 will be described.

In the control circuit 5, the combination of the switch control and the selected reference voltage in a sampling period which is the first period and the holding period which is the second period is executed in accordance with the quantization circuit output Qout supplied from the quantization circuit 4 as shown in FIG. 4.

First, when a value of Qout is "2", the control circuit 5 turns on the switches Sdb and Sd2 and turns off the switches Sdm, Sdt, and Sd3 during the sampling period. As a result, the input side of the DAC capacitor Cd is connected to Vrefm of "L" and the output side is connected to the AGND, so that the DAC capacitor Cd is charged with Vrefm−AGND.

Next, in the holding period, the switches Sdt and Sd3 are turned on, and the switches Sdb, Sdm, and Sd2 are turned off. As a result, the input side of the DAC capacitor Cd is connected to the Vrefp of "H", and the output side of the DAC capacitor Cd is connected to the inverting input terminal of the amplifier 31. As a result, the electric charges corresponding to the potential difference Vrefm−Vrefp between the reference voltages selected in the respective periods are transferred from the DAC capacitor Cd to the feedback capacitor Cf.

When the value of Qout is "1", the control circuit 5 turns on the switches Sdm and Sd2 and turns off the switches Sdt, Sdb, and Sd3 during the sampling period. As a result, since the input side of the DAC capacitor Cd is connected to Vcm of "0" and the output side is connected to AGND, if Vcm=AGND, the DAC capacitor Cd is kept 0V between the terminals.

Next, in the holding period, the switches Sdt and Sd3 are turned on, and the switches Sdb, Sdm, and Sd2 are turned off. As a result, the input side of the DAC capacitor Cd is connected to the Vrefp of "H", and the output side of the DAC capacitor Cd is connected to the inverting input terminal of the amplifier 31. In this way, the electric charges corresponding to the potential difference Vcm−Vrefp between the reference voltages selected in the respective periods are transferred from the DAC capacitor Cd to the feedback capacitor Cf.

When the value of Qout is "−1", the control circuit 5 turns on the switches Sdm and Sd2 and turns off the switches Sdt, Sdb, and Sd3 during the sampling period. As a result, since the input side of the DAC capacitor Cd is connected to Vcm of "0" and the output side is connected to AGND, if Vcm=AGND, the DAC capacitor Cd is kept 0V between the terminals.

Next, in the holding period, the switches Sdb and Sd3 are turned on, and the switches Sdt, Sdm, and Sd2 are turned off. As a result, the input side of the DAC capacitor Cd is connected to the Vrefm of "L", and the output side of the DAC capacitor Cd is connected to the non-inverting input terminal of the amplifier 31. In this way, the electric charges corresponding to the potential difference Vcm−Vrefm between the reference voltages selected in the respective periods are transferred from the DAC capacitor Cd to the feedback capacitor Cf.

When the value of Qout is "−2", the control circuit 5 turns on the switches Sdt and Sd2 and turns off the switches Sdb, Sdm, and Sd3 during the sampling period. As a result, the input side of the DAC capacitor Cd is connected to the Vrefp of "H", and the output side is connected to the AGND, so that the DAC capacitor Cd is charged with Vrefp−AGND.

Next, in the holding period, the switches Sdb and Sd3 are turned on, and the switches Sdt, Sdm, and Sd2 are turned off. As a result, the input side of the DAC capacitor Cd is connected to the Vrefm of "L", and the output side of the DAC capacitor Cd is connected to the non-inverting input terminal of the amplifier 31. In this way, electric charges corresponding to the potential difference Vrefp−Vrefm between the reference voltages selected in the respective periods are transferred from the DAC capacitor Cd to the feedback capacitor Cf.

In the above case, the voltage fed back from the D/A conversion circuit 6 to the output voltage of the amplifier becomes a voltage corresponding to one eighth of the potential difference of the reference voltage selected in each of the sampling period and the holding period from a value of a ratio of the DAC capacitor Cd and the feedback capacitor Cf, as described above. In addition, since a differential circuit configuration is generally employed, the potential difference of the selected reference voltage is doubled.

That is, when $Vref=(Vrefp-Vcm) \times 2=(Vcm-Vrefm) \times 2$ is met, Vref/8 or Vref/4 is added to the output voltage of the amplifier when the potential difference of the selected reference voltages is Vcm−Vrefm or Vrefp−Vrefm, and Vref/8 or Vref/4 is subtracted from the output voltage of the amplifier when the potential difference is Vcm−Vrefp or Vrefm−Vrefp.

Figures 5, 6:
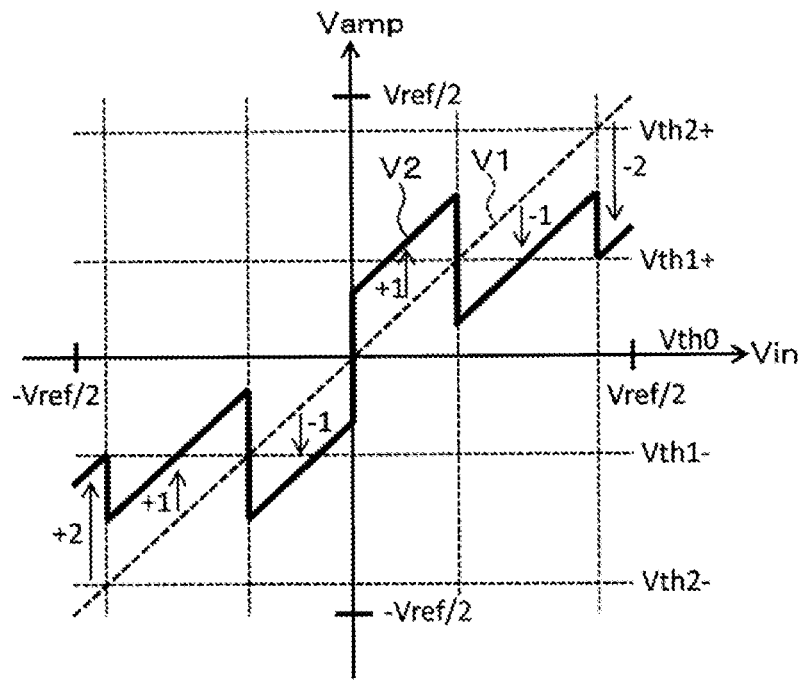
FIG. 5 is a diagram showing a relationship between an amplifier output voltage V1 and an amplifier output Vamp after first quantization.
FIG. 6 is a diagram illustrating the operation of the D/A conversion circuit corresponding to a first quantization Qout1 and a second quantization Qout2.

Next, the content of the first D/A conversion process by the D/A conversion circuit 6 will be described. As shown in FIG. 5, a relationship between the input potential Vin and the output voltage Vamp of the amplifier 31 is V1 before the D/A conversion and V2 after the D/A conversion.

Figures 7, 8:
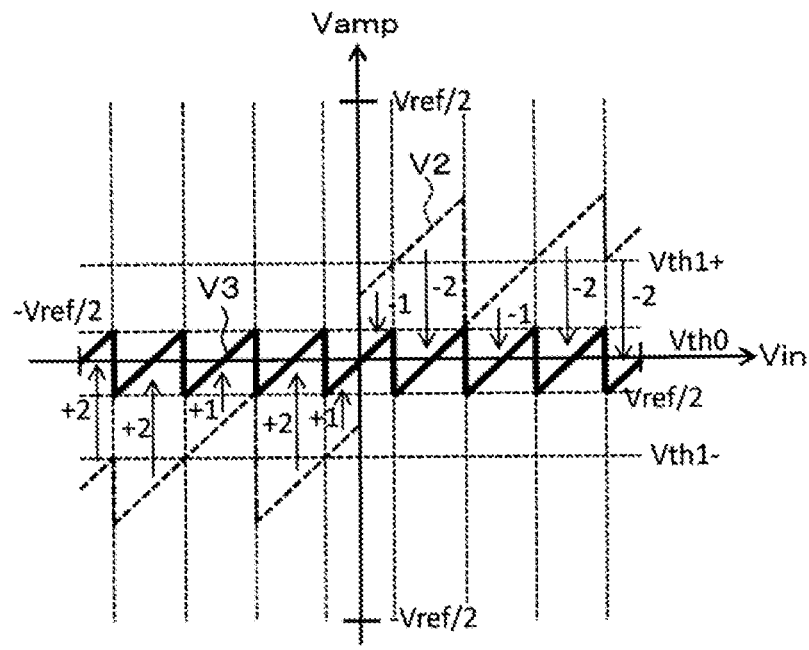
FIG. 7 is a diagram showing a relationship between an amplifier output voltage V2 and an amplifier output Vamp after the second quantization.
FIG. 8 is a diagram showing a condition of the first quantization by a threshold voltage.

First, when the first quantization is performed on the amplifier output voltage V1 before D/A conversion with five threshold voltages as described above in the quantization circuit 4, a quantized output Qout1 of four levels of "2", "1", "−1", and "−2" is obtained as shown in FIG. 8 according to the magnitude of the amplifier output voltage V1. Based on the above result, when the amplifier output voltage V1 is added to the output from the D/A conversion circuit 6, the following result is obtained.

The D/A conversion circuit 6 performs an operation as shown in FIG. 6 on the value Qout1 of the first quantization. In other words, when the Qout1 is "2", the operation becomes "L" in the sampling period and becomes "H" in the holding period. When the Qout1 is "1", the operation becomes "0" in the sampling period and becomes "H" in the holding period. When the Qout1 is "−1", the operation becomes "0" in the sampling period and becomes "L" in the holding period. When the Qout1 is "−2", the operation becomes "H" in the sampling period and becomes "L" in the holding period.

Therefore, when the output of the D/A conversion circuit 6 as a result of the first quantization is added to the amplifier output voltage V1, the amplifier output voltage V2 can be obtained as indicated by a thick solid line in FIG. 5. In that instance, the output Qout1 of the first quantization is "−1" when the amplifier output voltage V1 is greater than or equal to the threshold Vth0 and less than the threshold Vth1+, and is "1" when the amplifier output voltage V1 is greater than or equal to the threshold Vth1− and less than the threshold Vth0.

In the above-described case, regardless of the value of the quantization result Qout, the potential of the DAC capacitor Cd is output to the input terminal of the amplifier 31 in such a manner that Vcm is not selected as the reference voltage in the holding period, and therefore, even when the DAC capacitor Cd has a voltage characteristic, an output error can be inhibited from occurring due to the offset of the amplifier 31.

Next, the content of the second D/A conversion process by the D/A conversion circuit 6 will be described. As shown in FIG. 7, a relationship between the input potential Vin and the output voltage Vamp of the amplifier 31 is V2 after the first D/A conversion and V3 after the second A/D conversion.

In this example, when the second quantization is performed on the amplifier output voltage V2 before the D/A conversion with three threshold voltages as described above in the quantization circuit 4, as shown in FIG. 9, the quantized output Qout2 of four levels of "2", "1", "−1", and "−2" is obtained in accordance with the magnitude of the amplifier output voltage V2. Based on the above result, when the amplifier output voltage V2 is added to the output from the D/A conversion circuit 6, the following result is obtained. In that case, in the second quantization, as shown in FIG. 9, the threshold Vth2+ and the threshold Vth2− are not used for the amplifier output voltage V2, and the quantized output Qout2 is output in four levels.

In the D/A conversion circuit 6, the operation as shown in FIG. 6 is performed on the second quantization values Qout2 in the same manner as in the first quantization. In other words, when the Qout2 is "2", the operation becomes "L" in the sampling period and becomes "H" in the holding period. When the Qout2 is "1", the operation becomes "0" in the sampling period and becomes "H" in the holding period. When the Qout2 is "−1", the operation becomes "0" in the sampling period and becomes "L" in the holding period. When the Qout2 is "−2", the operation becomes "H" in the sampling period and becomes "L" in the holding period. Therefore, when the output of the D/A conversion circuit 6 as a result of the second quantization is added to the amplifier output voltage V2, the amplifier output voltage V3 can be obtained as indicated by a thick solid line in FIG. 7.

In the above-described case, as with the first D/A conversion, regardless of the value of the quantization result Qout, the potential of the DAC capacitor Cd is output to the input terminal of the amplifier 31 in such a manner that Vcm is not selected as the reference voltage in the holding period, so that even when the DAC capacitor Cd has the voltage characteristic, an output error can be inhibited from occurring due to the offset of the amplifier 31.

As described above, two quantization and D/A conversion processes can be performed, thereby being capable of outputting nine levels of quantization results. In that case, since the D/A conversion circuit 5 does not perform the operation of selecting Vcm in the holding period, the electric characteristic of the DAC capacitor Cd can be prevented from generating an error due to the offset of the amplifier 31, and therefore A/D conversion with high accuracy can be executed.

Next, referring to FIGS. 8 to 11, the results of summarizing the operations in the above-described two quantization and D/A conversion processes will be described. As described above, in the first quantization, as shown in FIG. 8, four levels of quantization result Qout1 are output for the amplifier output voltage V1 according to the five threshold voltages. In the second quantization, as shown in FIG. 9, four levels of quantization result Qout2 are output for the amplifier output voltage V2 according to three threshold voltages.

In this example, since the amplifier output voltage V2 before the second D/A conversion is the result of calculating a difference between the amplifier output voltage V1 before the first D/A conversion and the output of the D/A conversion circuit 6, the amplifier output voltage V2 can be expressed by the following Expression (1) using the output reference voltage Vref of the D/A conversion circuit 6.

Further, since Vref×Cd/Cf is a constant value, when Vref×Cd/Cf is set as VR, Expression (1) can be expressed in a simplified manner as the following Expression (2).

$$V2 = V1 - Qout1 \times Vref \times Cd/Cf \tag{1}$$

$$V2 = V1 - Qout1 \times VR \tag{2}$$

In this example, in the first quantization, as shown in FIG. 8, six determination conditions are set by five threshold voltages. At that time, for example, when the determination condition corresponds to the condition indicated by a symbol 1b, there is a possibility that the determination condition corresponds to two conditions indicated by symbols 2a and 2b in FIG. 9 in the second quantization.

In other words, although the second quantization corresponds to the amplifier output voltage V2, the conditions of 2a and 2b are rewritten using V1 shown in Expression (2). First, since the condition of the symbol 2a is represented by the following Expression (3), if Expression (2) is substituted for Expression (3), the following Expression (4) is obtained.

The condition of the symbol 2a: $V2 \geq Vth1+$ (3)

$\rightarrow V1 - Qout1 \times VR \geq Vth1+$ (4)

The condition of the symbol 2b condition: $Vth1+ > V2 \leq Vth0$ (5)

$\rightarrow Vth1+ > V1 - Qout1 \times VR \geq Vth0$ (6)

Therefore, when the amplifier output voltage V1 of the first quantization corresponds to the condition of the symbol 1b, that is, the following Expression (7), since Qout1 is "1", when the conditions of the symbols 2a and 2b are rewritten as the condition of the amplifier output voltage V1, the following Expressions (8) and (9) are obtained.

$Vth2+ > V1 \geq Vth1+$ (7)

The condition of the symbol 2a: $V1 - VR \geq Vth1+$
$\rightarrow V1 \geq Vth1++VR$ (8)

The condition of the symbol 2b: $Vth1+ > V1 - VR \geq Vth0 \rightarrow Vth1++VR > V1 \geq Vth0+VR$ (9)

As a result, when the condition of the symbol 1b of the first quantization is satisfied, the condition of the symbols 2a and 2b of the second quantization are expressed by the amplifier output voltage V1, as represented in the following Expressions (10) and (11).

The condition of the symbol 2a: $Vth2+ > V1 \geq Vth1++VR$ (10)

The condition of the symbol 2b: $Vth1++VR > V1 \geq Vth1+$ (11)

When the other symbols are rewritten in the same manner, the quantization values Qout2 in which portion divided into two levels are differ from each other are output, thereby being capable of finally obtaining the output of the quantization levels of nine levels as shown in FIG. 10.

Further, when the five threshold voltages described above are rewritten in relation to the above-mentioned reference voltage Vref, all the conditions can be set as the divided voltage of the reference voltage Vref as shown in FIG. 11.

According to the first embodiment described above, the D/A conversion circuit 6 outputs four levels of analog potentials based on the four levels of quantization result values of Qout "2", "1", "−1" and "−2". At that time, in the D/A conversion circuit 6, even if Vcm corresponding to AGND is selected in the sampling period, Vcm is not selected in the holding period, so that even when the amplifier 31 of the integrator circuit 3 has offsets, an error caused by the electric characteristics of the DAC capacitor Cd can be inhibited from occurring. This makes it possible to output an analog potential with high accuracy.

In addition, the four-level D/A conversion circuit 6 is used twice, thereby being capable of finally obtaining the output of nine levels in the A/D conversion circuit 1.

According to the present embodiment, as described above, in the D/A conversion circuit 6, the Vcm of the AGND potential which becomes high impedance is not used in the holding period, thereby being capable of inhibiting a decrease in the operation rate.

In addition, since the operation in the D/A conversion circuit 6 does not continuously use Vcm which is the AGND potential in the sampling period and the holding period, the output of the amplifier 31 will not be anchored to the same levels, thereby being capable of performing dither roles.

Second Embodiment

FIGS. 12 to 15 show a second embodiment, and different portions from the first embodiment will be described below. In the present embodiment, the setting conditions of the five threshold voltages Vth2+, Vth1+, Vth0, and Vth1− and Vth2− are changed.

More specifically, two threshold voltages Vth2+ and Vth2− among the threshold voltages are set differently from the first embodiment as follows.

$$Vth2+ = 5/16 \times Vref(V)$$

$$Vth2- = -5/16 \times Vref(V)$$

Figure 12:
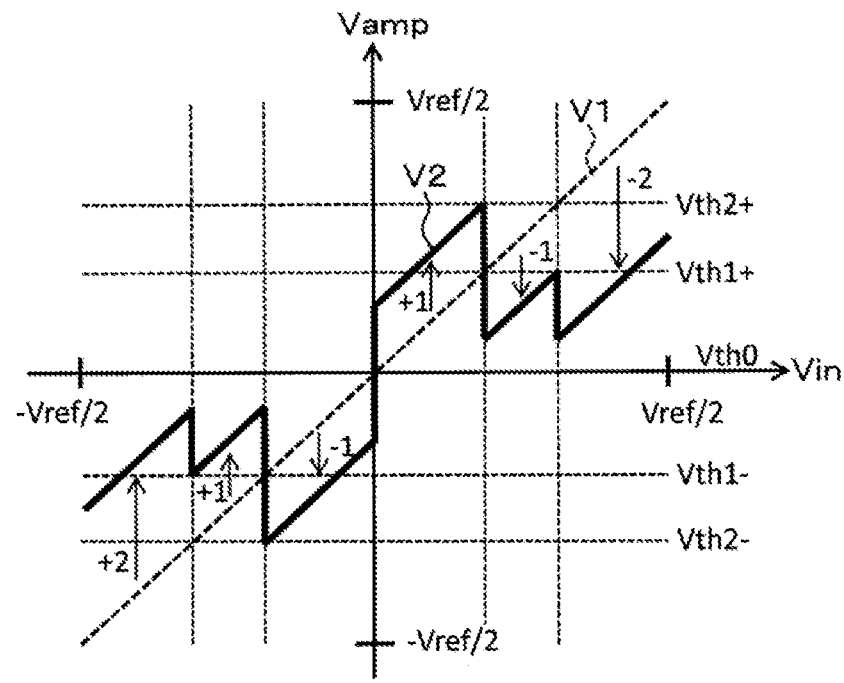
FIG. 12 is a diagram showing a relationship between an amplifier output voltage V1 and an amplifier output Vamp after the first quantization according to a second embodiment.

Next, the content of the first D/A conversion process by the D/A conversion circuit 6 will be described. As shown in FIG. 12, a relationship between an input potential Vin and an output voltage Vamp of an amplifier 31 is V1 before D/A conversion and V2 after the D/A conversion.

When a first quantization (hereinafter referred to as first quantization) is performed using five threshold voltages on the amplifier output voltage V1 prior to D/A conversion in the quantization circuits 4, four levels of quantized output Qout1 of "2", "1", "−1", and "−2" are obtained as shown in FIG. 8 according to a magnitude of the amplifier output voltage V1. Based on the above result, when the amplifier output voltage V1 is added to the output from the D/A conversion circuit 6, the following result is obtained.

The D/A conversion circuit 6 performs an operation as shown in FIG. 6 on the first quantized output Qout1. Therefore, when the output of the D/A conversion circuit 6 as a result of the first quantization is added to the amplifier output voltage V1, the amplifier output voltage V2 can be obtained as indicated by a thick solid line in FIG. 12. In this instance, the first quantized output Qout1 is "−1" when the amplifier output voltage V1 is greater than or equal to the threshold Vth0 and less than the threshold Vth1+, and is "1" when the amplifier output voltage V1 is greater than or equal to the threshold Vth1− and less than the threshold Vth0.

In the above-described case, regardless of the value of the quantization result Qout, the potential of the DAC capacitor Cd is output to the input terminal of the amplifier 31 in such a manner that Vcm is not selected as the reference voltage in the holding period, and therefore, even when the DAC capacitor Cd has a voltage characteristic, an output error can be inhibited from occurring due to the offset of the amplifier 31.

Figure 13:
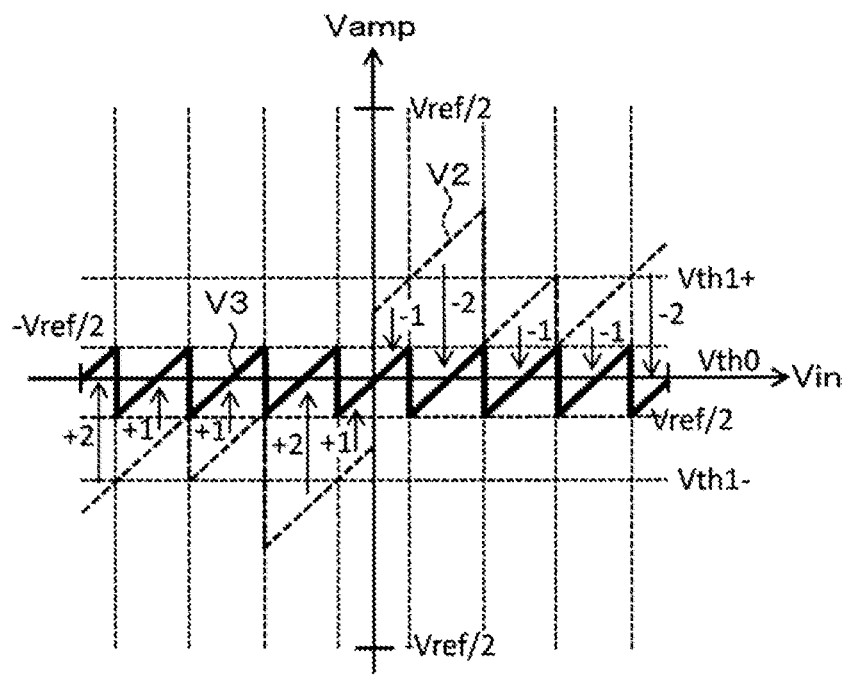
FIG. 13 is a diagram showing a relationship between an amplifier output voltage V2 and the amplifier output Vamp after the second quantization.

Next, the content of the second D/A conversion process by the D/A conversion circuit 6 will be described. As shown in FIG. 13, a relationship between the input potential Vin and the output voltage Vamp of the amplifier 31 is V2 after the first D/A conversion and V3 after the second A/D conversion.

In this example, when the second quantization is performed on the amplifier output voltage V2 before the D/A conversion with three threshold voltages as described above in the quantization circuit 4, the quantized output Qout2 of four levels of "2", "1", "−1", and "−2" is obtained according to the magnitude of the amplifier output voltage V2. Based on the above result, when the amplifier output voltage V1 is added to the output from the D/A conversion circuit 6, the following result is obtained. In that case, in the second quantization, as shown in FIG. 9, the threshold Vth2+ and the threshold Vth2− are not used for the amplifier output voltage V2, and the quantized output Qout2 is output in four levels.

In the D/A conversion circuit 6, the operation as shown in FIG. 6 is performed on the second quantization values Qout2 in the same manner as in the first quantization. Therefore, when the output of the D/A conversion circuit 6 as a result of the second quantization is added to the amplifier output voltage V2, the amplifier output voltage V3 can be obtained as indicated by a thick solid line in FIG. 13. In that case, similarly to the first D/A conversion, since the potential of the DAC capacitor Cd is output to an input terminal of the amplifier 31 in such a manner that Vcm is not selected as the reference voltage in the holding period regardless of the value of the quantization result Qout, even when the DAC capacitor Cd has voltage characteristics, an output error can be inhibited from occurring due to the offset of the amplifier 31.

As described above, two quantization and D/A conversion processes can be performed, thereby being capable of outputting nine levels of quantization results. In that case, since the D/A conversion circuit 6 does not perform the operation of selecting Vcm in the holding period, the electric characteristic of the DAC capacitor Cd can be prevented from generating an error due to the offset of the amplifier 31, and therefore the A/D conversion with high accuracy can be executed.

Next, referring to FIGS. 14 and 15, the results of summarizing the operations in the above-described two quantization and D/A conversion processes will be described. As described above, in the first quantization, as shown in FIG. 8, four levels of quantization result Qout1 are output for the amplifier output voltage V1 according to the five threshold voltages. In the second quantization, as shown in FIG. 9, four levels of quantization result Qout2 are output for the amplifier output voltage V2 according to three threshold voltages.

In this example, since the amplifier output voltage V2 before the second D/A conversion is the result of calculating a difference between the amplifier output voltage V1 before the first D/A conversion and the output of the D/A conversion circuit 6, the amplifier output voltage V2 can be expressed as the above-mentioned Expression (1) using the output reference voltage Vref of the D/A conversion circuit 6, and when Vref×Cd/Cf=VR is set, the amplifier output voltage V2 can be expressed as the above-mentioned Expression (2).

In this example, in the first quantization, as shown in FIG. 8, six determination conditions are set by five threshold voltages. At that time, for example, when the condition shown by a symbol 1a is satisfied, there is a possibility that the two conditions shown by symbols 2a and 2b in FIG. 9 are satisfied in the second quantization.

In other words, although the second quantization corresponds to the amplifier output voltage V2, the conditions of 2a and 2b are rewritten using V1 shown in Expression (2). First, since the condition of the symbol 2a is represented by the following Expression (12), if Expression (2) is substituted for Expression (12), the following Expression (13) is obtained. Similarly, since the condition of the symbol 2b is represented by the following Expression (14), if Expression (2) is substituted for Expression (14), the following Expression (15) is obtained.

$$\text{The condition of symbol } 2a: V2 \geq Vth1+ \quad (12)$$

$$\rightarrow V1 - Qout1 \times VR \geq Vth1+ \quad (13)$$

$$\text{The condition of symbol } 2b: Vth1+ > V2 \geq Vth0 \quad (14)$$

$$\rightarrow Vth1+ > V1 - Qout1 \times VR \geq Vth0 \quad (15)$$

Therefore, when the amplifier output voltage V1 of the first quantization corresponds to the condition of the symbol 1 a, that is, the following Expression (16), the Qout1 is "2", and therefore, when the conditions of the symbols 2a and 2b are rewritten as the condition of the amplifier output voltage V1, the following Expressions (16) and (17) are obtained.

$$V1 \geq Vth2+ \quad (16)$$

$$\text{The condition of symbol } 2a: V1 - 2VR \geq Vth1+ \\ \rightarrow V1 \geq Vth1++2VR \quad (17)$$

$$\text{The condition of symbol } 2b: Vth1+ > V1 - \\ 2VR \geq Vth0 \rightarrow Vth1++2VR > V1 \geq Vth0+2VR \quad (18)$$

As a result, when the condition of the symbol 1a of the first quantization is satisfied, the conditions of the symbols 2a and 2b of the second quantization are expressed by the amplifier output voltages V1, as shown in the following Expressions (19) and (20).

$$\text{The condition of symbol } 2a: V1 \geq Vth1++2VR \quad (19)$$

$$\text{The condition of symbol } 2b: Vth1++2VR > V1 \geq Vth2+ \quad (20)$$

When the other symbols are rewritten in the same manner, the quantization values Qout2 in which portion divided into two levels are differ from each other are output, thereby being capable of finally obtaining the output of the quantization levels of nine levels as shown in FIG. 14.

Further, when the five threshold voltages described above are rewritten in relation to the above-mentioned reference voltage Vref, all the conditions can be set as the divided voltage of the reference voltage Vref as shown in FIG. 15.

According to the second embodiment described above, the same operation and effects as those of the first embodiment can be obtained.

Third Embodiment

FIG. 16 to FIG. 19 show a third embodiment, and different portions from the second embodiment will be described below. In the present embodiment, the setting conditions of the five threshold voltages Vth2+, Vth1+, Vth0, and Vth1− and Vth2− are changed.

More specifically, two thresholds Vth2+ and Vth2− among threshold voltages are set differently from those of the first embodiment as follows.

$$Vth2+ = \tfrac{9}{16} \times Vref(V)$$

$$Vth2- = -\tfrac{9}{16} \times Vref(V)$$

Figure 16:
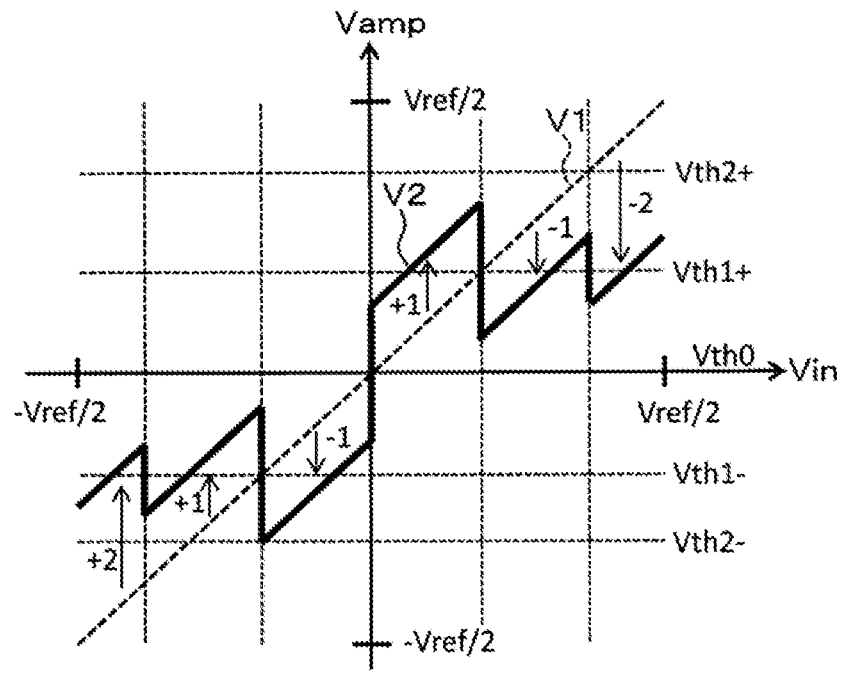
FIG. 16 is a diagram showing a relationship between an amplifier output voltage V1 and an amplifier output Vamp after the first quantization according to a third embodiment.

Next, the content of the first D/A conversion process by the D/A conversion circuit 6 will be described. As shown in FIG. 16, a relationship between an input potential Vin and an output voltage Vamp of an amplifier 31 is V1 before D/A conversion and V2 after the D/A conversion.

When the first quantization is performed on the amplifier output voltage V1 prior to the D/A conversion with five threshold voltages in a quantization circuit 4, four levels of quantized output Qout1 of "2", "1", "−1", and "−2" are obtained according to the magnitude of the amplifier output voltage V1, as shown in FIG. 8. Based on the above result, when the amplifier output voltage V1 is added to the output from the D/A conversion circuit 6, the following result is obtained.

The D/A conversion circuit 6 performs an operation as shown in FIG. 6 on the first quantization Qout1. Therefore, when the output of the D/A conversion circuit 6 as a result of the first quantization is added to the amplifier output voltage V1, the amplifier output voltage V2 can be obtained as shown by a thick solid line in FIG. 16. In that instance, the output Qout1 of the first quantization is "−1" when the amplifier output voltage V1 is greater than or equal to the threshold Vth0 and less than the threshold Vth1+, and is "1" when the amplifier output voltage V1 is greater than or equal to the threshold Vth1− and less than the threshold Vth0.

In the above-described case, regardless of the value of the quantization result Qout, the potential of the DAC capacitor Cd is output to the input terminal of the amplifier 31 in such a manner that Vcm is not selected as the reference voltage in the holding period, and therefore, even when the DAC capacitor Cd has a voltage characteristic, an output error can be inhibited from occurring due to the offset of the amplifier 31.

Figure 17:
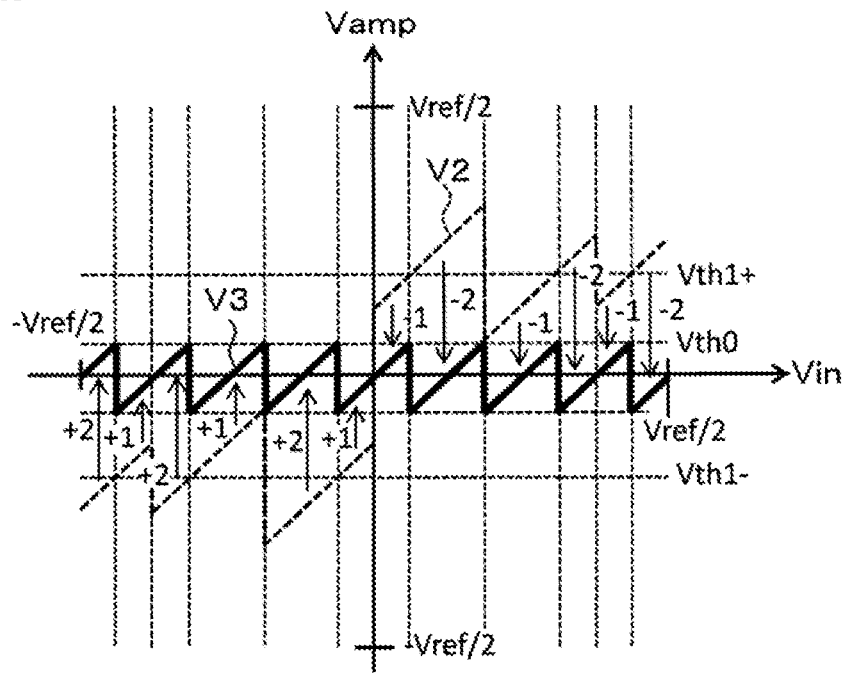
FIG. 17 is a diagram showing a relationship between the amplifier output voltage V2 and an amplifier output Vamp after the second quantization.

Next, the content of the second D/A conversion process by the D/A conversion circuit 6 will be described. As shown in FIG. 17, a relationship between the input potential Vin and the output voltage Vamp of the amplifier 31 is V2 after the first D/A conversion and V3 after the second A/D conversion.

In this example, when the second quantization is performed on the amplifier output voltage V2 before the D/A conversion with three threshold voltages as described above in the quantization circuit 4, the quantized output Qout2 of four levels of "2", "1", "−1", and "−2" is obtained according to the magnitude of the amplifier output voltage V2. Based on the above result, when the amplifier output voltage V1 is added to the output from the D/A conversion circuit 6, the following result is obtained. In that case, in the second quantization, as shown in FIG. 9, the threshold Vth2+ and the threshold Vth2− are not used for the amplifier output voltage V2, and the quantized output Qout2 is output in four levels.

In the D/A conversion circuit 6, the operation as shown in FIG. 6 is performed on the second quantization values Qout2 in the same manner as in the first quantization. Therefore, when the output of the D/A conversion circuit 6 as a result of the second quantization is added to the amplifier output voltage V2, the amplifier output voltage V3 can be obtained as shown by a thick solid line in FIG. 17. In that case, similarly to the first D/A conversion, since the potential of the DAC capacitor Cd is output to an input terminal of the amplifier 31 in such a manner that Vcm is not selected as the reference voltage in the holding period regardless of the value of the quantization result Qout, even when the DAC capacitor Cd has voltage characteristics, an output error can be inhibited from occurring due to the offset of the amplifier 31.

As described above, two quantization and D/A conversion processes can be performed, thereby being capable of outputting nine levels of quantization results. In that case, since the D/A conversion circuit 6 does not perform the operation of selecting Vcm in the holding period, the electric characteristic of the DAC capacitor Cd can be prevented from generating an error due to the offset of the amplifier 31, and therefore the A/D conversion with high accuracy can be executed.

Next, referring to FIGS. 18 and 19, the results of summarizing the operations in the two quantization and D/A conversion processes described above will be described. As described above, in the first quantization, as shown in FIG. 8, four levels of quantization result Qout1 are output for the amplifier output voltage V1 according to the five threshold voltages. In the second quantization, as shown in FIG. 9, four levels of quantization result Qout2 are output for the amplifier output voltage V2 according to three threshold voltages.

In this example, since the amplifier output voltage V2 before the second D/A conversion is the result of calculating a difference between the amplifier output voltage V1 before the first D/A conversion and the output of the D/A conversion circuit 5, the amplifier output voltage V2 can be expressed as the above-mentioned Expression (1) using the output reference voltage Vref of the D/A conversion circuit 6, and when Vref×Cd/Cf=VR is set, the amplifier output voltage V2 can be expressed as the above-mentioned Expression (2).

In this example, in the first quantization, as shown in FIG. 8, six determination conditions are set by five threshold voltages. At that time, for example, when the condition indicated by the symbol 1a is satisfied, the condition of the symbols 2a and 2b of the second quantization is indicated by the amplifier output voltage V1, as in the second embodiment, as shown in the following Expressions (19) and (20).

For example, when the determination condition corresponds to the condition indicated by a symbol 1 b, there is a possibility that the determination condition corresponds to two conditions indicated by symbols 2a and 2b shown in FIG. 9 in the second quantization. In other words, although the second quantization corresponds to the amplifier output voltage V2, the conditions of 2a and 2b are rewritten using the amplifier output voltage V1 shown in Expression (2). First, since the condition of the symbol 2a is represented by the following Expression (21), if Expression (2) is substituted for Expression (21), the following Expression (22) is obtained. Similarly, since the condition of the symbol 2b is represented by the following Expression (23), if Expression (2) is substituted for Expression (23), the following Expression (24) is obtained.

$$\text{Symbol } 2a \text{ condition: } V2 \geq Vth1+ \tag{21}$$

$$\rightarrow V1 - Qout1 \times VR \geq Vth1+ \tag{22}$$

$$\text{Symbol } 2b \text{ condition: } Vth1+ > V2 \geq Vth0 \tag{23}$$

$$\rightarrow Vth1+ > V1 - Qout1 \times VR \geq Vth0 \tag{24}$$

Therefore, when the amplifier output voltage V1 of the first quantization corresponds to the condition of the symbol 1 b, that is, the following Expression (17), the Qout1 is "1", and therefore, when the conditions of the symbols 2a and 2b are rewritten as the condition of the amplifier output voltage V1, the following Expressions (25) and (26) are obtained.

$$Vth2+ > V1 \geq Vth1+ \tag{7}$$

$$\text{The condition of the symbol } 2a: V1 - VR \geq Vth1+ \\ \rightarrow V1 \geq Vth1+ + VR \tag{25}$$

$$\text{The condition of the symbol } 2b: Vth1+ > V1 - \\ VR \geq Vth0 \rightarrow Vth1+ + VR > V1 \geq Vth0 + VR \tag{26}$$

As a result, when the condition of the symbol 1b of the first quantization is satisfied, the condition of the symbols 2a and 2b of the second quantization is represented by the input V1, as shown in the following Expressions (27) and (28).

$$\text{The condition of symbol } 2a: Vth2+ > V1 \geq Vth1+ + VR \tag{27}$$

$$\text{The condition of symbol } 2b: Vth1+ + VR > V1 \geq Vth1+ \tag{28}$$

When the other symbols are rewritten in the same manner, the quantization values Qout2 which are divided into two levels and differ from each other are output, so that the output of the quantization levels of nine levels can be finally obtained as shown in FIG. 18.

Further, when the five threshold voltages described above are rewritten in relation to the above-mentioned reference voltage Vref, all the conditions can be set as the divided voltage of the reference voltage Vref as shown in FIG. 19.

According to the third embodiment as well, the same operation and effects as those of the first embodiment can be obtained. In the third embodiment, the threshold voltages Vth2+ and Vth2− are set to be integral multiples of the thresholds Vth1+ and Vth1−, respectively, so that the threshold voltage generation circuit can have a simple configuration.

Other Embodiments

Although the present disclosure has been described in accordance with the examples, it is understood that the present disclosure is not limited to such examples or structures. The present disclosure encompasses various modifications and variations within the scope of equivalents. In addition, various combinations and configurations, as well as other combinations and configurations that include only one element, more, or less, are within the scope and spirit of the present disclosure.

What is claimed is:

1. A D/A conversion circuit having an output terminal connected to an input terminal of an operational amplifier that is connected to a quantization circuit, the D/A conversion circuit comprising:
   a DAC capacitor;
   a selection switch that selectively switches among a reference potential, a first voltage higher than the reference potential, and a second voltage lower than the reference potential to apply to an input side of the DAC capacitor as an analog potential;
   a ground switch that connects an output side of the DAC capacitor to an analog ground potential; and
   an output switch that connects the output side of the DAC capacitor to the output terminal, wherein:
   in a first period, the selection switch selects one of the reference potential, the first voltage and the second voltage according to one of four levels output from the quantization circuit as a quantization result value, and connects the one of the reference potential, the first voltage and the second voltage to the input side of the DAC capacitor, and the ground switch turns on to charge the DAC capacitor; and in a second period subsequent to the first period, the selection switch selects one of the first voltage and the second voltage according to the one of four levels, and connects the one of the first voltage and the second voltage to the input side of the DAC capacitor, and the output switch turns on to output the analog potential having one of four levels to the output terminal from the DAC capacitor.

2. The D/A conversion circuit according to claim 1, wherein:

the four levels of the quantization result value includes a value of "+2", a value of "+1", a value of "4" and a value of "−2";

the selection switch selects the second voltage in the first period and selects the first voltage in the second period when the quantization result value is the value of "+2";

the selection switch selects the reference potential in the first period and selects the first voltage in the second period when the quantization result value is the value of "+1";

the selection switch selects the reference potential in the first period and selects the second voltage in the second period when the quantization result value is the value of "−1"; and the selection switch selects the first voltage in the first period and selects the second voltage in the second period when the quantization result value is the value of "−2".

3. The D/A conversion circuit according to claim 2, wherein:

the quantization circuit provides the quantization result value obtained by executing a process repetitively twice;

in the process, the analog potential is compared with five threshold voltages to convert the analog potential into one of the four levels;

the process includes a first quantization process and a second quantization process;

the five threshold voltages include a positive second threshold, a positive first threshold, a reference threshold, negative first threshold and a negative second threshold;

in the first quantization process, the analog potential is converted into the value of "+2" as a digital value when the analog potential is equal to or higher than the positive second threshold, the analog potential is converted into the value of "+1" as the digital value when the analog potential is lower than the positive second threshold and equal to or higher than the positive first threshold, the analog potential is converted into the value of "−1" as the digital value when the analog potential is lower than the positive first threshold and equal to or higher than the reference threshold, the analog potential is converted into the value of "+1" as the digital value when the analog potential is lower than the reference threshold and equal to or higher than the negative first threshold, the analog potential is converted into the value of "−1" as the digital value when the analog potential is lower than the negative first threshold and equal to or higher than the negative second threshold, and the analog potential is converted into the value of "−2" as the digital value when the analog potential is lower than the negative second threshold;

in the second quantization process, the analog potential is converted into the value of "+2" as the digital value when the analog potential is equal to or higher than the positive first threshold, the analog potential is converted into the value of "+1" as the digital value when the analog potential is lower than the positive first threshold and equal to or higher than the reference threshold, the analog potential is converted into the value of "−1" as the digital value when the analog potential is lower than the reference threshold and equal to or higher than the negative first threshold, the analog potential is converted into the value of "−2" as the digital value when the analog potential is lower than the negative first threshold and equal to or higher than the negative second threshold;

the quantization circuit generates the digital value having nine levels when the output terminal outputs the analog potential having four levels after the first and second periods.

4. A quantization circuit that compares an analog potential with five threshold voltages, converts the analog potential into a digital value having four levels, and generates an input digital signal to be input into the D/A conversion circuit according to claim 2, wherein:

the five threshold voltages include: a reference threshold corresponding to the reference potential; a positive first threshold higher by a first voltage difference than the reference threshold; a negative first threshold lower by the first voltage difference than the reference threshold; a positive second threshold higher by a second voltage difference than the reference threshold; a negative second threshold lower by the second voltage difference than the reference threshold;

the second voltage difference is higher than the first voltage difference;

the quantization circuit converts the analog potential into the value of "+2" as a digital value when the analog potential is equal to or higher than the positive second threshold;

the quantization circuit converts the analog potential into the value of "+1" as the digital value when the analog potential is lower than the positive second threshold and equal to or higher than the positive first threshold;

the quantization circuit converts the analog potential into the value of "−1" as the digital value when the analog potential is lower than the positive first threshold and equal to or higher than the reference threshold;

the quantization circuit converts the analog potential into the value of "+1" as the digital value when the analog potential is lower than the reference threshold and equal to or higher than the negative first threshold;

the quantization circuit converts the analog potential into the value of "−1" as the digital value when the analog potential is lower than the negative first threshold and equal to or higher than the negative second threshold; and the quantization circuit converts the analog potential into the value of "−2" as the digital value when the analog potential is lower than the negative second threshold.

5. The quantization circuit according to claim 4, wherein:

an absolute value of the second voltage difference between the reference threshold and the positive second threshold or between the reference threshold and the negative second threshold is larger than an absolute value of the first voltage difference between the reference threshold and the positive first threshold or between the reference threshold and the negative first threshold; and the absolute value of the second voltage difference is equal to an integral multiple of the absolute value of the first voltage difference.

6. The quantization circuit according to claim 4, wherein:

an absolute value of the second voltage difference between the reference threshold and the positive second threshold or between the reference threshold and the negative second threshold is larger than an absolute value of the first voltage difference between the reference threshold and the positive first threshold or between the reference threshold and the negative first threshold; and the absolute value of the second voltage difference is smaller than twice the absolute value of the first voltage difference.

7. An A/D conversion circuit comprising:

the D/A conversion circuit according to claim 2;

a quantization circuit; and an amplifier that adds an analog potential input from an outside and the analog potential output from the D/A conversion circuit to obtain an input analog potential of the quantization circuit, wherein:

the quantization circuit compares an analog potential with five threshold voltages, converts the analog potential into a digital value having four levels, and generates an input digital signal to be input into the D/A conversion circuit;

the five threshold voltages include: a reference threshold corresponding to the reference potential; a positive first threshold higher by a first voltage difference than the reference threshold; a negative first threshold lower by the first voltage difference than the reference threshold; a positive second threshold higher by a second voltage difference than the reference threshold; a negative second threshold lower by the second voltage difference than the reference threshold;

the second voltage difference is higher than the first voltage difference;

the quantization circuit converts the analog potential into the value of "+2" as a digital value when the analog potential is equal to or higher than the positive second threshold;

the quantization circuit converts the analog potential into the value of "+1" as the digital value when the analog potential is lower than the positive second threshold and equal to or higher than the positive first threshold;

the quantization circuit converts the analog potential into the value of "−1" as the digital value when the analog potential is lower than the positive first threshold and equal to or higher than the reference threshold;

the quantization circuit converts the analog potential into the value of "+1" as the digital value when the analog potential is lower than the reference threshold and equal to or higher than the negative first threshold;

the quantization circuit converts the analog potential into the value of "−1" as the digital value when the analog potential is lower than the negative first threshold and equal to or higher than the negative second threshold; and the quantization circuit converts the analog potential into the value of "−2" as the digital value when the analog potential is lower than the negative second threshold.

8. The A/D conversion circuit according to claim 7, wherein:

the A/D conversion circuit is configured by a $\Delta\Sigma$ modulation type A/D conversion circuit, and the quantization circuit executes a conversion process at least twice in response to the analog potential input from the outside to generate a digital value having 9 levels.

9. The A/D conversion circuit according to claim 7, wherein:

the conversion process includes a first conversion process and a second conversion process;

in a second conversion process, the quantization circuit generates a digital value of "2" when the analog potential input from the outside is equal to or higher than the positive first threshold, the quantization circuit generates the digital value of "+1" when the analog potential input from the outside is lower than the positive first threshold and equal to or higher than the reference threshold, the quantization circuit generates the digital value of "−1" when the analog potential input from the outside is lower than the reference threshold and equal to or higher than the negative first threshold, the quantization circuit generates the digital value of "−2" when the analog potential input from the outside is lower than the negative first threshold.

10. The A/D conversion circuit according to claim 7, wherein:

an absolute value of the second voltage difference between the reference threshold and the positive second threshold or between the reference threshold and the negative second threshold is larger than an absolute value of the first voltage difference between the reference threshold and the positive first threshold or between the reference threshold and the negative first threshold; and the absolute value of the second voltage difference is equal to an integral multiple of the absolute value of the first voltage difference.

11. The A/D conversion circuit according to claim 7, wherein:

an absolute value of the second voltage difference between the reference threshold and the positive second threshold or between the reference threshold and the negative second threshold is larger than an absolute value of the first voltage difference between the reference threshold and the positive first threshold or between the reference threshold and the negative first threshold; and the absolute value of the second voltage difference is smaller than twice the absolute value of the first voltage difference.

* * * * *